(12) United States Patent
Ziegler et al.

(10) Patent No.: US 9,178,096 B2
(45) Date of Patent: *Nov. 3, 2015

(54) LUMINESCENT SOLAR CONCENTRATOR

(71) Applicant: Leidos, Inc., Reston, VA (US)

(72) Inventors: John Paul Ziegler, San Diego, CA (US); Howard Walter Walker, San Diego, CA (US); Richard Holmes Griffey, Vista, CA (US); Newell Convers Wyeth, Oakton, VA (US)

(73) Assignee: Leidos, Inc., Reston, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/515,134

(22) Filed: Oct. 15, 2014

(65) Prior Publication Data
US 2015/0287864 A1 Oct. 8, 2015

Related U.S. Application Data

(63) Continuation of application No. 13/468,474, filed on May 10, 2012, now Pat. No. 8,866,001.

(51) Int. Cl.
*H02N 6/00* (2006.01)
*H01L 31/042* (2014.01)
(Continued)

(52) U.S. Cl.
CPC ........ *H01L 31/055* (2013.01); *H01L 31/02168* (2013.01); *H01L 31/035218* (2013.01); *H01L 31/056* (2014.12)

(58) Field of Classification Search
CPC .................. H01L 31/02322; H01L 31/02327; H01L 31/035218; H01L 31/0525; H01L 31/055; H01L 31/0232; H01L 31/02325; H01L 31/054; H01L 31/0547

USPC ................... 136/247, 248, 257, 259
See application file for complete search history.

(56) References Cited

U.S. PATENT DOCUMENTS

| | | | |
|---|---|---|---|
| 4,097,309 A | 6/1978 | Horne | 136/89 PC |
| 4,144,097 A | 3/1979 | Chambers et al. | 136/89 PC |

(Continued)

FOREIGN PATENT DOCUMENTS

| | | | |
|---|---|---|---|
| WO | WO 2010/023657 | 3/2010 | H01L 31/055 |
| WO | WO 2010/043414 | 4/2010 | H01L 31/055 |

OTHER PUBLICATIONS

American Dye Source, "Quantum Dots," http://www.adsdyes.com/quantumdots.html, Retrieved: May 13, 2013.

(Continued)

*Primary Examiner* — Eli Mekhlin
(74) *Attorney, Agent, or Firm* — Dawn-Marie Bey; Bey & Cotropia PLLC

(57) ABSTRACT

A stacked luminescent solar concentrator includes two separate absorption/emission cells, each having a layer of luminophore-type material, wherein a top layer is a high band gap layer comprised of quantum dots in polymer, wherein the quantum dots are engineered so as to absorb a significant percentage of photons above bandgap. The bottom layer is a lower band gap layer comprised of quantum dots in polymer, wherein the quantum dots in the second layer are engineered so as to absorb photons not absorbed in the top layer, thus increasing total percentage of absorbed photons. Photovoltaic cells are located below the layers at the bottom of the cells or at the edges of the cells. The sides and lower surfaces of the cells may include reflective surfaces as discussed further herein. Reflection losses from the top surface thereof may be minimized using a broadband anti-reflective coating (AR) on the surface.

20 Claims, 9 Drawing Sheets

(51) Int. Cl.
*H01L 31/055* (2014.01)
*H01L 31/056* (2014.01)
*H01L 31/0216* (2014.01)
*H01L 31/0352* (2006.01)

(56) References Cited

U.S. PATENT DOCUMENTS

| | | | |
|---|---|---|---|
| 4,153,813 A | 5/1979 | Blieden et al. | 136/89 PC |
| 4,164,432 A | 8/1979 | Boling | 136/89 PC |
| 4,292,959 A | 10/1981 | Coburn, Jr. | 126/438 |
| 4,357,486 A | 11/1982 | Blieden et al. | 136/247 |
| 6,476,312 B1 | 11/2002 | Barnham | 136/247 |
| 7,629,424 B2 | 12/2009 | Malik et al. | 526/240 |
| 7,989,153 B2 | 8/2011 | Skipor et al. | 430/322 |
| 8,041,171 B2 | 10/2011 | Buretea et al. | 385/123 |
| 2005/0161693 A1 | 7/2005 | Sugiura et al. | 257/98 |
| 2006/0107993 A1 | 5/2006 | Krokoszinski et al. | 136/247 |
| 2009/0032083 A1 | 2/2009 | Torrance et al. | 136/246 |
| 2009/0056791 A1 | 3/2009 | Pfenninger et al. | 136/247 |
| 2009/0317044 A1 | 12/2009 | Buretea et al. | 385/132 |
| 2010/0314646 A1 | 12/2010 | Breen et al. | 257/98 |
| 2011/0030792 A1 | 2/2011 | Miguez et al. | 136/259 |
| 2011/0245533 A1 | 10/2011 | Breen et al. | 562/8 |
| 2012/0060897 A1 | 3/2012 | Bomm et al. | 136/247 |

OTHER PUBLICATIONS

Barnham, Keith, et al., "Quantum-Dot Concentrator and Thermodynamic Model for the Global Redshift," Applied Physics Letters, 76(9), Feb. 28, 2000, pp. 1197-1199.
Bawendi, M. G., et al., "X-Ray Structural Characterization of Larger CdSe Semiconductor Clusters," J. Chem. Phys., 91(11), Dec. 1, 1989, pp. 7282-7290.
Bomm, Jana, et al., "Fabrication and Full Characterization of State-of-the-Art Quantum Dot Luminescent Solar Concentrators," Solar Energy Materials & Solar Cells, vol. 95, 2011, pp. 2087-2094.
Coe-Sullivan, Seth, et al., "Tuning the Performance of Hybrid Organic/Inorganic Quantum Dot Light-Emitting Devices," Organic Electronics, vol. 4, 2003, pp. 123-130.
Currie, Michael J., et al., "High-Efficiency Organic Solar Concentrators for Photovoltaics," Science, vol. 321, Jul. 11, 2008, pp. 226-228.
Cytodiagnostics, "Fluorescent Nanocrystals (Quantum Dots)," http://www.cytodiagnostics.com/fluorescent-nanocrystals.php?gclid=CPra5emS068CFckbQgod8jlKfg, Retrieved: May 13, 2013
Dabbousi, B. O., et al., "Electroluminescence from CdSe Quantum-Dot/Polymer Composites," Appl. Phys. Lett., 66(11), Mar. 13, 1995, pp. 1316-1318.
Dabbousi, B. O., et al., "(CdSe)ZnS Core-Shell Quantum Dots: Synthesis and Characterization of a Size Series of Highly Luminescent Nanocrystallites," J. Phys. Chem., 101(46), 1997, pp. 9463-9475.
Evident Technologies, "The Technology—Advanced," http://www.evidenttech.com/technology/advanced, Retrieved: May 13, 2013.
Friedman, P.S., et al., "Luminescent Solar Concentrator Development," Solar Energy Research Institute: Toledo, Ohio, Apr. 1987.
Gallahger, S. J., et al., "Quantum Dot Solar Concentrators: Electrical Conversion Efficiencies and Comparative Concentrating Factors of Fabricated Devices," Solar Energy, vol. 81, 2007, pp. 813-821.
Harris, J. S., et al., "Photovoltaic Concentrator Solar Cells," Role of Electro-Optics in Photovoltaic Energy Conversion, vol. 248, 1980, pp. 97-105.

Hermann, A. M., et al., "Luminescent Solar Concentrators—a Review," Solar Energy, 29(4), 1982, pp. 323-329.
Hines, Margaret A., "Synthesis and Characterization of Strongly Luminescing ZnS-Capped CdSe Nanocrystals," J. Phys. Chem., 100(2), 1996, 468-471.
Invitrogen, "Molecular Probes Product Brands," http://www.invitrogen.com/site/us/en/home/brands/Molecular-Probes/Key-Molecular-Probes-Products/Qdot.html?s_kwcid=TC%7C12303%7-Cquantum%20dots%7C%7CS%7Cp%7C8516649974&cid=covinvggl89100000002335s, Retrieved: May 13, 2013.
Ivanov, Sergei A., et al., "Type-II Core/Shell CdS/ZnSe Nanocrystals: Synthesis, Electronic Structures, and Spectroscopic Properties," J. Am. Chem. Soc., 129(38), 2007, pp. 11708-11719.
Kennedy, M., et al., "Improving the Optical Efficiency and Concentration of a Single-Plate Quantum Dot Solar Concentrator using Near Infra-Red Emitting Quantum Dots," Solar Energy, 83(7), 2009, pp. 978-981.
Kennedy, Manus, et al., "Improving the Optical Efficiency and Concentration of a Single-Plate Quantum Dot Solar Concentrator Using Infra-Red Emitting Quantum Dots," Dublin Energy Lab: Dublin, Ireland, Jul. 1, 2009.
Kim, Sungjee, et al., "Type-II Quantum Dots: CdTe/CdSe(Core/Shell) and CdSe/ZnTe(Core/Shell) Heterostructures," J. Am. Chem. Soc., 125(38), 2003, pp. 11466-11467.
Murray, C. B., et al., "Synthesis and Characterization of Nearly Monodisperse CdE (E=S, Se, Te) Semiconductor Nanocrystallites," J. Am. Chem. Soc., 115(19), 1993, pp. 8706-8715.
Murray, C. B., et al., "Synthesis and Chracterization of Monodisperse Nanocrystals and Close-Packed Nanocrystal Assemblies," Annu. Rev. Mater. Sci., vol. 30, 2000, pp. 545-610.
Nano Optical Materials, "Visible CdSe/ZnS Quantum Dots," http://www.nanoopticalmaterials.com/?gclid=CMrB77OQ068CFYgFRQod8CLndQ, Retrieved: May 13, 2013.
Ocean NanoTech, Home Page, http://www,oceannanotech.com/?gclid=CLfK89CQ068CFYgFRQ0d8CLndQ, Retrieved: May 13, 2013.
Peng, Xiaogang, et al., "Epitaxial Growth of Highly Luminescent CdSe/CdS Core/Shell Nanocrystals with Photostability and Electronic Accessibility," J. Am. Chem. Soc., 119(30), 1997, pp. 7019-7029.
Peng, Xiaogang, et al., "Shape Control of CdSe Nanocrystals," Nature, vol. 404, Mar. 2, 2000, pp. 59-61.
Pradhan, Narayan, et al., "An Alternative of CdSe Nanocrystal Emitters: Pure and Tunable Impurity Emissions in ZnSe Nanocrystals," J. Am. Chem. Soc., 127(50), 2005, pp. 17586-17587.
Sloof, L. H., et al., "A Luminescent Solar Concentrator With 7.1% Power Conversion Efficiency," Phys. Stat. Sol., 2(6), 2008, pp. 257-259.
Werts, Martinus H. V., et al., "Flurescein and Eosin as Sensitizing Chromophores in Near-Infrared Luninescent Ytterbium(III), Neodymium(III) Erbium(III) Chelates," Chemical Physical Letters, vol. 276, 1997, pp. 196-201.
Wittwer, V., et al., "Fluorescent Planar Concentrators," Solar Energy Materials, vol. 11, 1984, pp. 187-197.
Xie, Renguo, "Synthesis and Characterization of Highly Luminescent CdSe-Core CdS/Zn0.5Cd0.5S/ZnS Multishell Nanocrystals," J. Am. Chem. Soc., 127(20), 2005, pp. 7480-7488.
Zimmerman, Paul A., et al., "High Index 193 nm Immersion Lithography: the Beginning or the End of the Road," Optical Microlithography, XXII. Ed. Harry J. Levinson & Mircea V. Dusa, San Jose, CA, USA: SPIE, 2009, Proc. of SPIE, vol. 7274.

FIGURE 2 - Prior Art

LUMINESCENT SOLAR CONCENTRATOR

CROSS-REFERENCE TO RELATED APPLICATIONS

The present application is a continuation of U.S. patent Ser. No. 13/468,474, filed May 10, 2012, now U.S. Pat. No. 8,866, 001, titled "Luminescent Solar Concentrator," which is incorporated herein by reference in its entirety.

GOVERNMENT RIGHTS STATEMENT

Certain embodiments herein were made with government support under Contract No. HR0011-10-C-0081 awarded by Defense Advance Research Projects Agency (DARPA). The government has certain rights in those embodiments.

BACKGROUND

1. Field of the Embodiments

The embodiments are generally directed to luminescent solar concentrator systems and more particularly to combinations of materials and layer architectures for improving power output.

2. Summary of Existing Art

The ability to generate useful power from the sun forms the basis of an entire industry—the solar industry. The applications for such power are too numerous to list. Depending on the application, there are many design trade-offs that must be made between economics and efficiency. For example, design characteristics will vary significantly between large, stationary solar arrays that are permanently installed in the desert and portable solar arrays for relatively quick set-up, e.g., by soldiers, hikers or others on the move who might require a smaller power output from the solar collection system.

In order to reduce the number and/or size of photovoltaic cells (PVCs) in a solar collection system, and thus reduce expense, imaging solar concentrators have been developed to collect sunlight over a large area and direct it onto a small area of PVCs. Such concentrators must track the sun across the sky and require precise alignment with the underlying PVCs in order to maximize collection. Such imaging solar concentrators are unable to make use of diffuse solar radiation.

An alternative to the imaging solar concentrator is a non-imaging concentrator. A particular implementation of a non-imaging concentrator is a luminescent solar concentrator (LSCs). In prior art implementations, an LSC is comprised of transparent plates, e.g., glass or polymer, containing luminophores, e.g., organic dyes, that absorb solar spectrum. Resulting from the absorption, the luminescence from the luminophore is down shifted to longer wavelength which is in the absorption spectrum of the PVC which has been optimized for the luminophore. The concentration results from light pipe trapping of luminescence.

Descriptions of existing implementations of LSC collection systems are found in the following references which are incorporated herein by reference in their entirety: A. M. Hermann, "Luminescent solar concentrators—A review," *Solar Energy*, vol. 29, no. 4, pp. 323-329, 1982; P. S. Friedman and C. R. Parent, "Luminescent solar concentrator development," SERI/STR-211-3149, 1980; V. Wittwer, W. Stahl, and A. Goetzberger, "Fluorescent planar concentrators," *Sol. Energy Mater.*, vol. 11, no. 3, pp. 187-197, 1984; P. S. Friedman, "Progress on the development of luminescent solar concentrators," in *SPIERole of Electro-Optics in Photovoltaic Energy Conversion*, 1980, pp. 98-104; K. Barnham et al., "Quantum-dot concentrator and thermodynamic model for the global redshift," *Appl. Phys. Lett.*, vol. 76, no. 9, pp. 1197-1199, 2000; M. H. V. Werts, et al., "Fluorescein and eosin as sensitizing chromophores in near-infrared luminescent ytterbium(III), neodymium(III) and erbium(III) chelates," *Chem. Phys. Lett.*, vol. 276, no. 3/4, pp. 196-201, 1997; M. J. Currie et al., "High-Efficiency Organic Solar Concentrators for Photovoltaics", *Science* 321 (2008), p. 226; L. H. Sloof, et al., "A luminescent solar concentrator with 7.1% efficiency", *phys. stat. sol. (RRL)*, 2(6), pp. 257-259 (2008); M. Kennedy, et al, "Improving the optical efficiency and concentration of a single-plate quantum dot solar concentrator using near infra-red emitting quantum dots", *Solar Energy* 83 (2009); S. J. Gallagher, B. Norton, P. C. Eames, "Quantum dot solar concentrators: Electrical conversion efficiencies and comparative concentrating factors of fabricated devices", *Solar Energy*, 81, (2007); Zimmerman, Paul A., et al, "High Index 193 nm immersion lithography: the beginning or the end of the road." Optical Microlithography XXII. Ed. Harry J. Levinson & Mircea V. Dusa, San Jose, Calif., USA SPIR 2009, 727420-11. While these existing LSC collection systems theoretically should provide for systems having increased efficiency due to use of both direct and diffuse solar radiation, actual implementations have not heretofore proven out the theory.

There is a need for a portable solar collection system which is of a size and flexibility that allows for relatively easy set-up and also produces enough power so as to be useful for the user's purposes.

SUMMARY OF THE EMBODIMENTS

In a first embodiment, a luminescent solar collector system includes: a first surface for receiving solar radiation; a first film layer for absorbing a first wavelength range of the received solar radiation and emitting a first amount of luminescent photons in proportion thereto, the first film layer including: (a) a first polymer base; (b) first quantum dots; and (c) an additional luminophore; a second surface located opposite the first surface, wherein a top face of the second surface faces the first film layer and a bottom face of the second surface includes at least one first photovoltaic cell included thereon; and a first reflective surface located between the first and second surfaces for directing at least a portion of the first amount of luminescent photons to the at least one first photovoltaic cell.

In a second embodiment, a luminescent solar collector system includes: a first surface for receiving solar radiation; a first film layer for absorbing a first wavelength range of the received solar radiation and emitting a first amount of luminescent photons in proportion thereto, the first film layer including at least first quantum dots; a second surface located opposite the first surface, wherein a top face of the second surface faces the first film layer and a bottom face of the second surface includes at least one first photovoltaic cell included thereon; and a first reflective surface located between the first and second surfaces for directing at least a portion of the first amount of luminescent photons to the at least one first photovoltaic cell; a third surface facing the bottom face of the second surface; a second film layer for absorbing a second wavelength range of the received solar radiation and emitting a second amount of luminescent photons in proportion thereto, the second film layer including at least second quantum dots; a fourth surface located opposite the third surface, wherein a top face of the fourth surface faces the second film layer and a bottom face of the fourth surface includes at least one second photovoltaic cell included thereon; and a second reflective surface located between the third and fourth surfaces for directing at least a portion of the second amount of luminescent photons to the at least one second photovoltaic cell.

In a third embodiment, a luminescent solar collector system includes: first and second opposing surfaces having a first film layer therebetween for absorbing a first wavelength range of a received solar radiation and emitting a first amount of luminescent photons in proportion thereto, the first film layer including at least first quantum dots; a third surface perpendicular to the first and second surfaces, contacting first ends thereof; a fourth surface perpendicular to the first and second surfaces, contacting second ends thereof, wherein at least one of the third and fourth surfaces includes at least one first photovoltaic cell thereon; and a first reflective surface located on at least one of the first and second surfaces for directing at least a portion of the first amount of luminescent photons to the at least one first photovoltaic cell; a fifth surface opposite the fourth surface and separated therefrom by one of an air gap or a low index material, wherein the fifth surface and an opposing sixth surface have a second film layer therebetween for absorbing a second wavelength range of the received solar radiation and emitting a second amount of luminescent photons in proportion thereto, the second film layer including at least second quantum dots; a seventh surface perpendicular to the fifth and sixth surfaces, contacting first ends thereof; an eighth surface perpendicular to the fifth and sixth surfaces, contacting second ends thereof, wherein at least one of the seventh and eighth surfaces includes at least one second photovoltaic cell thereon; and a second reflective surface located on at least one of the fifth and sixth surfaces for directing at least a portion of the second amount of luminescent photons to the at least one second photovoltaic cell.

BRIEF SUMMARY OF THE FIGURES

The following figures are intended to be part of the present specification and considered in combination with the description herein.

DETAILED DESCRIPTION

Figure 1:
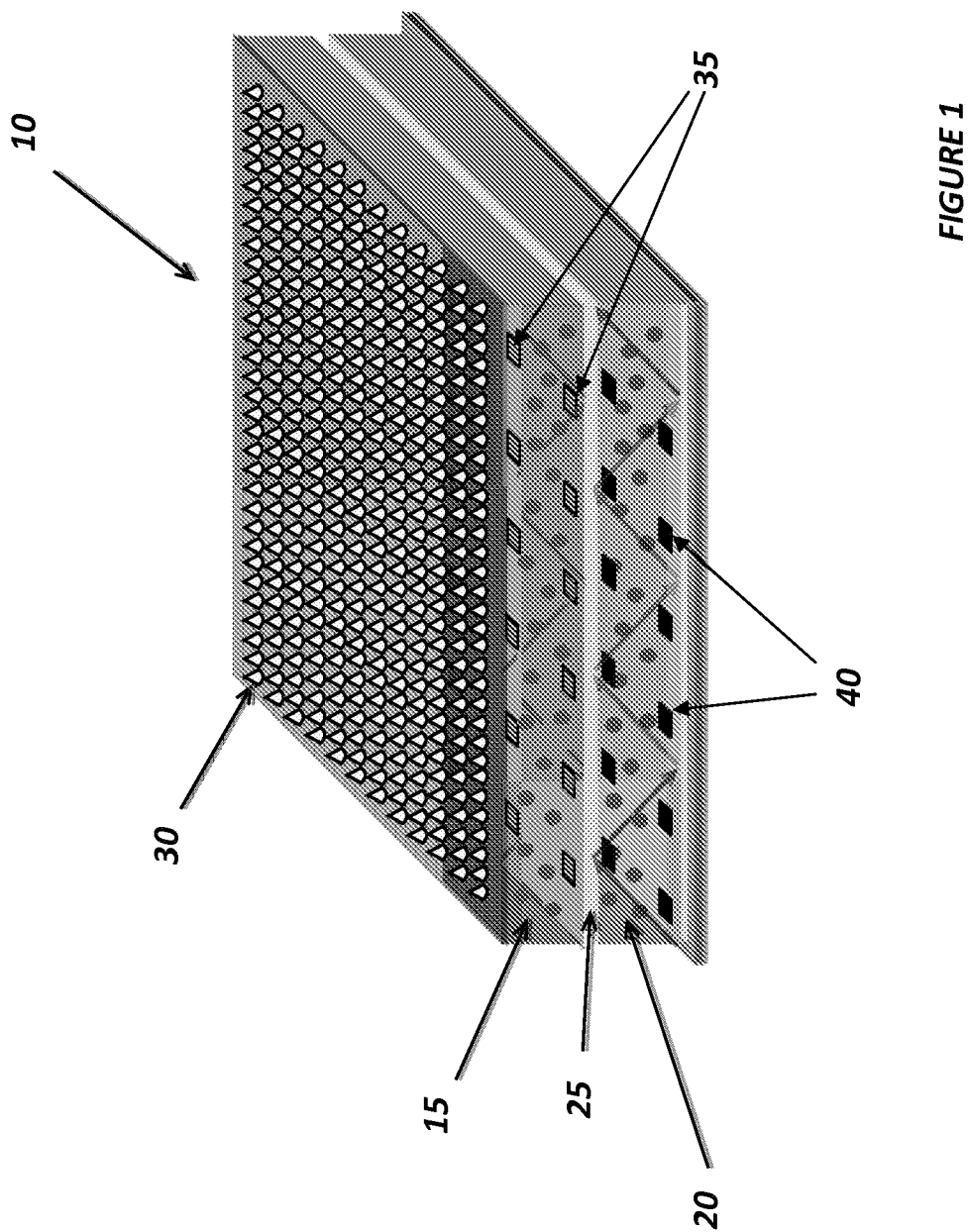
FIG. 1 is an exemplary LSC collection system in accordance with at least one embodiment described herein.

Referring to FIG. 1, an exemplary embodiment includes an LSC collection system 10 that includes at least two stacked luminophore layers 15 and 20 which enhances sunlight to power efficiency through one or more of: use of optimized quantum dots (QDs) as the luminophore; use of optimized high refractive index polymer layer and optimized PVCs. Portability is achieved through, for example, optimized PVCs matched to the output of the quantum dot luminophores. Portability is achieved through, for example, use of lightweight and flexible LSC layers with flexible PVCs mounted on the front, back and/or sides of the LSC and use of a flexible backplane for electrical interconnects.

More particularly, in the exemplary preferred embodiment, layer 15 may include a short wavelength absorbing layer comprised of quantum dots in polymer, wherein the quantum dots are engineered so as to absorb a significant percentage of photons in the short wavelength region. The second layer 20 is a longer wavelength absorbing layer comprised of quantum dots in polymer, wherein the quantum dots in the second layer are engineered so as to absorb photons not absorbed in layer 15, thus increasing total percentage of absorbed photons. In system 10, an air gap or low index material layer 25 may be used between the layers in order to maintain total internal reflection (TIR) within the individual layers. The sides and lower surface may include mirrored surfaces as discussed further herein. Reflection losses from the top surface thereof may be minimized using a broadband anti-reflective coating (AR) 30 on the surface, while losses out of the loss cone may be minimized by use of band stop filters. The emissions from the quantum dots are collected by PVCs 35 and 40. A bottom reflector may also be position below the second layer, separated by an air gap or low material layer similar to layer 25. Suitable low index materials are known to those skilled in the art. Additional details of the particulars of exemplary systems are described herein.

While the embodiment described with respect to FIG. 1 illustrate two absorption/emission layers, one skilled in the art recognizes that dual layers are not necessarily required and a single layer or multiple layers may be utilized.

The first and second layers 15, 20 are formed of different combinations of polymer and quantum dot configurations and potentially a third (and fourth) luminophore component as discussed further herein. In a preferred embodiment, the host polymer has a refractive index (RI) greater than 1.5 and preferably, ≥1.8, and exhibits the following features: flexibility, ultraviolet (UV) photostability, no phase separation, and no or low loss in efficiency of quantum dots when incorporated into polymer films. The increased RI of the polymer host material will decrease the amount of luminescense that is lost or, said another way, it will increase the percentage of luminescense that is trapped within the layers and available for concentrating to PVCs.

Figure 2:
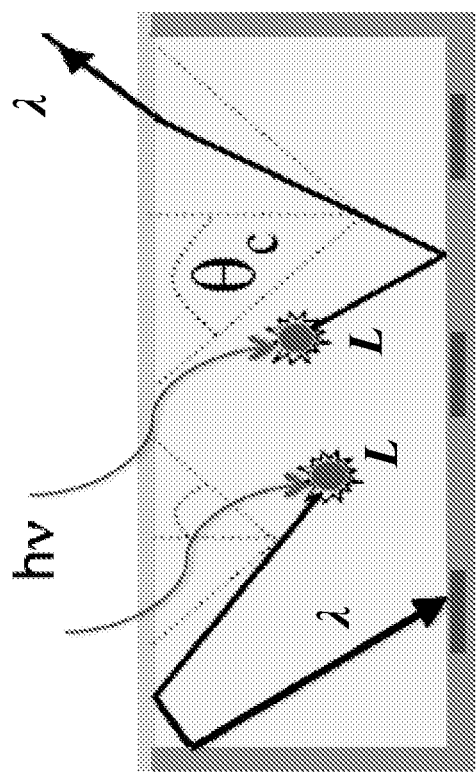
FIG. 2 is a schematic of a prior art LSC collection system.

Referring to prior art FIG. 2 we know solar radiation (hv) is absorbed by luminophores. The luminophores (L) re-radiate light isotropically at longer λ and radiation emitted within θc (the loss cone) escapes from the device. If emitted at >θc it is captured and concentrated via TIR and can be absorbed by PVCs placed on the sides and/or top and/or bottom of the device. The critical angle (θc) for TIR:

$$\theta c = \sin^{-1}(1/n)$$

For a typical polymer host with RI ("n") of 1.5 in air:

$$\theta c = \sin^{-1}(1/1.5) = 42°$$

And the luminescence (P) escaping out of the loss cone:

$$P = 1 - [1-(1/1.5^2)]^{1/2} = 0.255$$

Hence, only about 75% of the luminescence is trapped by TIR in prior art systems. In accordance with the equations herein, increasing the host polymer RI d e creases the critical angle and therefore decreases the percentage of luminescence that escapes.

Figure 3:
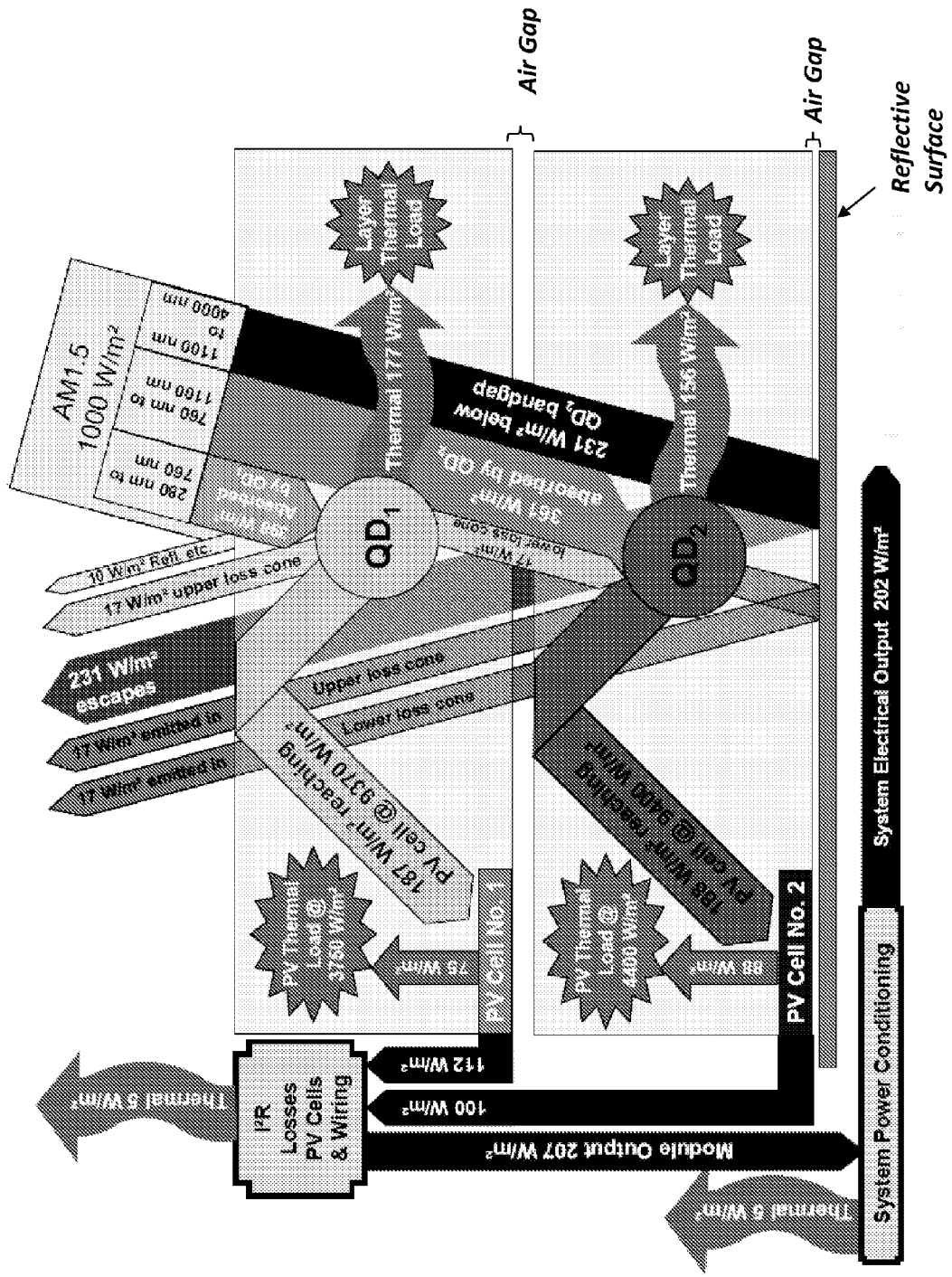
FIG. 3 is a schematic showing radiation paths for an exemplary dual stack LSC collection system in accordance with an embodiment described herein.

FIG. 3 is a detailed schematic showing the energy flow for an exemplary dual layer LSC system of FIG. 1 wherein $QD_1$ and $QD_2$ are the active luminophore species in each layer with $QD_1$ LSC layer absorbing in the 280 nm to 560 nm range and emitting at approximately 600 nm (hereafter referred to as the "600 nm" QD) and $QD_2$ LSC layer absorbing in the 280 nm to 760 nm range and emitting at approximately 800 nm (hereafter referred to as the "800 nm" QD). FIG. 3 shows the basic energy flow paths necessary to calculate the system energy efficiency. An optical model was used to treat all reflection losses at the various optical interfaces and absorption throughout the system. The model was used to optimize the individual components in order to maximize system efficiency. FIG. 3 shows the air gaps (or location of low index material) and bottom reflective surface described above with respect to FIG. 1.

A key limit to efficient optical collection of the luminescence photons is re-absorption in the LSC layers. Accordingly, in a preferred embodiment, the system includes quantum dots engineered to have a "Stokes shift" or gap between the longest wavelength absorption peak and the emission peak of at least 50 nm. An antireflection (AR) coating on the upper surface of the $QD_1$ LSC layer provided low reflection over a broadband wavelength range (<1% from 400-1400 nm) and omnidirectional AR performance (<1% up to 50° incident angle). A specular mirror reflecting 100% of incident photons is placed below (but not in contact with) the lower surface of the $QD_2$ LSC layer. The $QD_2$ LSC layer has a perfect anti-reflection coating on its lower surface so that all photons reflected by the specular mirror re-enter the $QD_2$ LSC layer.

In addition, specialized spectral reflecting coatings are used on each LSC layer. For the $QD_1$ LSC layer, it is assumed that a reflective coating on the lower surface reflects 100% of all wavelengths shorter than a specified wavelength 'cut-off' wavelength value and transmits 100% of wavelengths longer than the "cut off" wavelength value. This reflective coating allows the short wavelength solar photons to have a double pass through the $QD_1$ LSC layer. This permits a reduced concentration of $QD_1$ for the same net solar absorption as a one pass system; the reduced $QD_1$ concentration reduces the re-absorption of luminescence photons as they propagate toward the PVCs. One skilled in the art understands that the effect of this reflective coating becomes less important as QDs with less re-absorption become available.

Loss Cone (LC) refers to the cone of internal incidence angles for which luminescence photons escape from an LSC layer with refractive index (RI) greater than the surrounding medium. For the $QD_1$ LSC layer, the upper LC cannot be 'plugged' without interfering with the entrance of solar photons, and photons escaping through the lower LC of this layer are absorbed in the $QD_2$ LSC layer. Meanwhile, for the $QD_2$ LSC LCs, the lower LC photons are sent back into the layer by the specular mirror (see above). To help 'plug' the upper LC of the $QD_2$ LSC, it is assumed that a reflective coating on the upper surface transmits 100% of all wavelengths shorter than a specified 'cut-off' wavelength value and reflects a specified percentage of wavelengths longer than that "cut-off" value. This reflective coating transmits the incident solar photons that are energetic enough (short enough wavelength) to excite the $QD_2$, but reflects a portion of the longer wavelength luminescence photons in the Bottom LSC upper LC.

The term Collection Factor (CF) refers to the fraction of emitted luminescence photons that reach the PVCs instead of escaping via the LCs or being re-absorbed by a QD. The net value of CF is the essential predictor of the energy efficiency of a given LSC geometry and materials set. In addition to the established dependence of CF on QD re-absorption and LSC RI, CF also depends on LSC geometry (including PVC placement). For linear, rectangular arrays of PVCs, the principal geometric variable is the width of the area next to a PVC in which are generated the luminescent photons that are collected by that PVC. The analysis assumes a unit LSC layer as a square of side s and thickness d, with upper and lower LSCs aligned in tandem. Photovoltaic cells (PVCs) are attached to one pair of opposite edges of the square, while the other pair of opposite edges is coated with a lossless reflecting coating. The input solar spectrum (AM1.5) is incident on the upper side of the Top LSC layer, which has a collecting area of $s^2$. The total PVC area is $2sd$, and the effective Concentration Ratio (CR) is $s/2d$. When the CR is specified for a given value of d, the value of s is determined in accordance with the model in FIG. 3.

Figure 4:
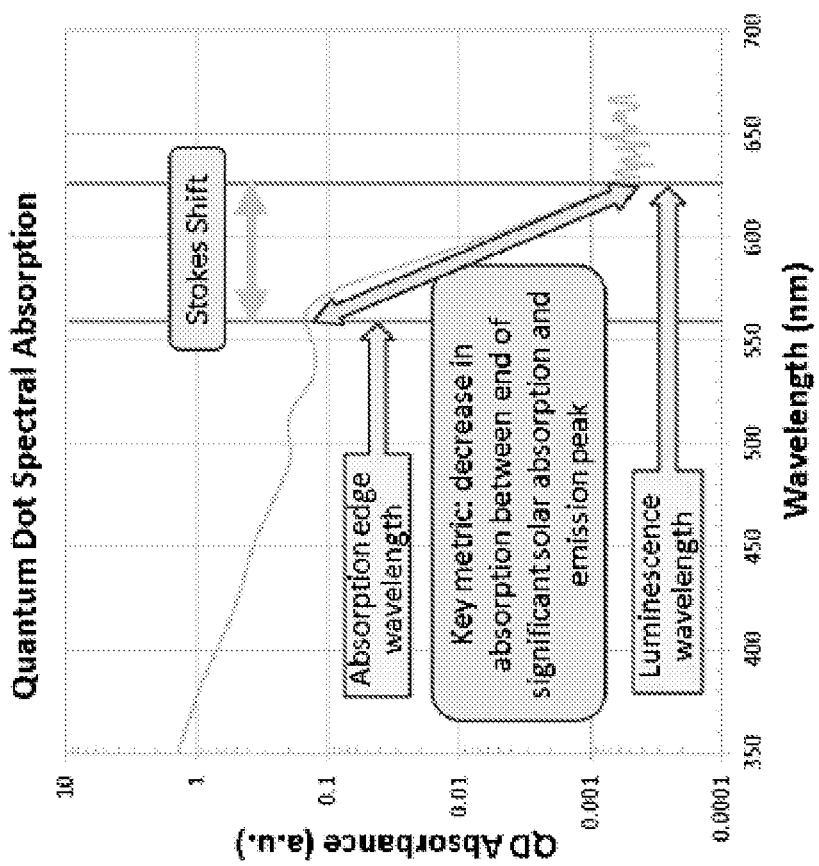
FIG. 4 is a quantum dot absorption chart.

In an ideal LSC system, the luminophore concentration in the layer would absorb most of the solar photons above its band-gap but would re-absorb a negligible fraction of the luminescent photons as they propagate toward the PVCs. How well a particular QD approaches this ideal can be assessed by the graph exemplified by FIG. 4 showing how much the absorption decreases between the absorption edge and the luminescence peak wavelength position. If the QDs have significant re-absorption of their luminescence, system modeling has to treat the phenomenon of re-absorption and re-emission in the LSC layer. Since the QDs as prepared contain a distribution of sizes and spectral characteristics, a detailed picture of this distribution is used to model how the luminescence photons are absorbed and re-emitted with ever longer (Stokes shifted) wavelengths during their propagation either to the PVCs or to escape through the loss cones (LCs).

The QD size distribution is assumed to be a normal (Gaussian) distribution, centered on the size that emits at the peak of the measured emission curve. Using the relationship between the QD spectral properties and the QD size, the spectral width (in units of photon energy) of the QD distribution is calculated using the measured width of the emission peak and the estimated intrinsic width of the emission spectrum from a single QD size. This spectral spread of the QD distribution is used to estimate the absorption curve for a single QD that, when integrated over the QD distribution, will give the measured absorption spectrum of the QD sample.

Figure 5:
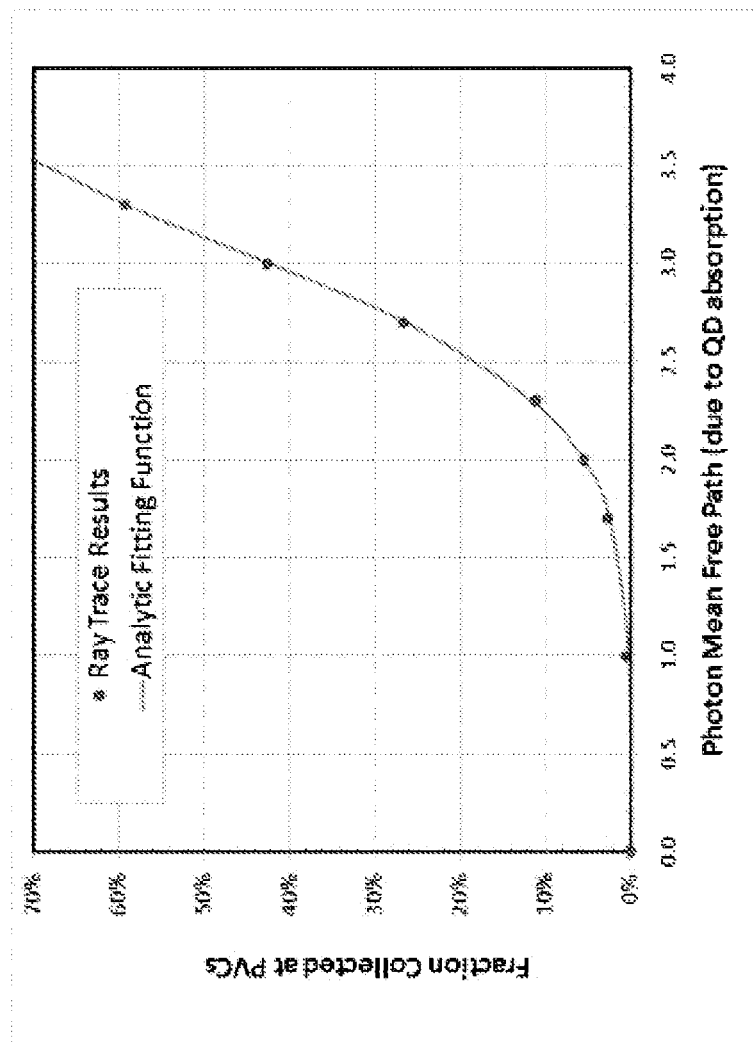
FIG. 5 is a chart showing the fitting function derived from the numerical raytracing results that gave the CF for the square LSC geometry as a function of the luminescent photon mean free path.

In order to model the multiple events resulting in the spectral shift of the luminescent photons in an LSC with the QDs described herein, the fitting function shown in FIG. 5 was derived from the numerical raytracing results that gave the CF for the square LSC geometry as a function of the luminescent photon mean free path.

Figure 6:
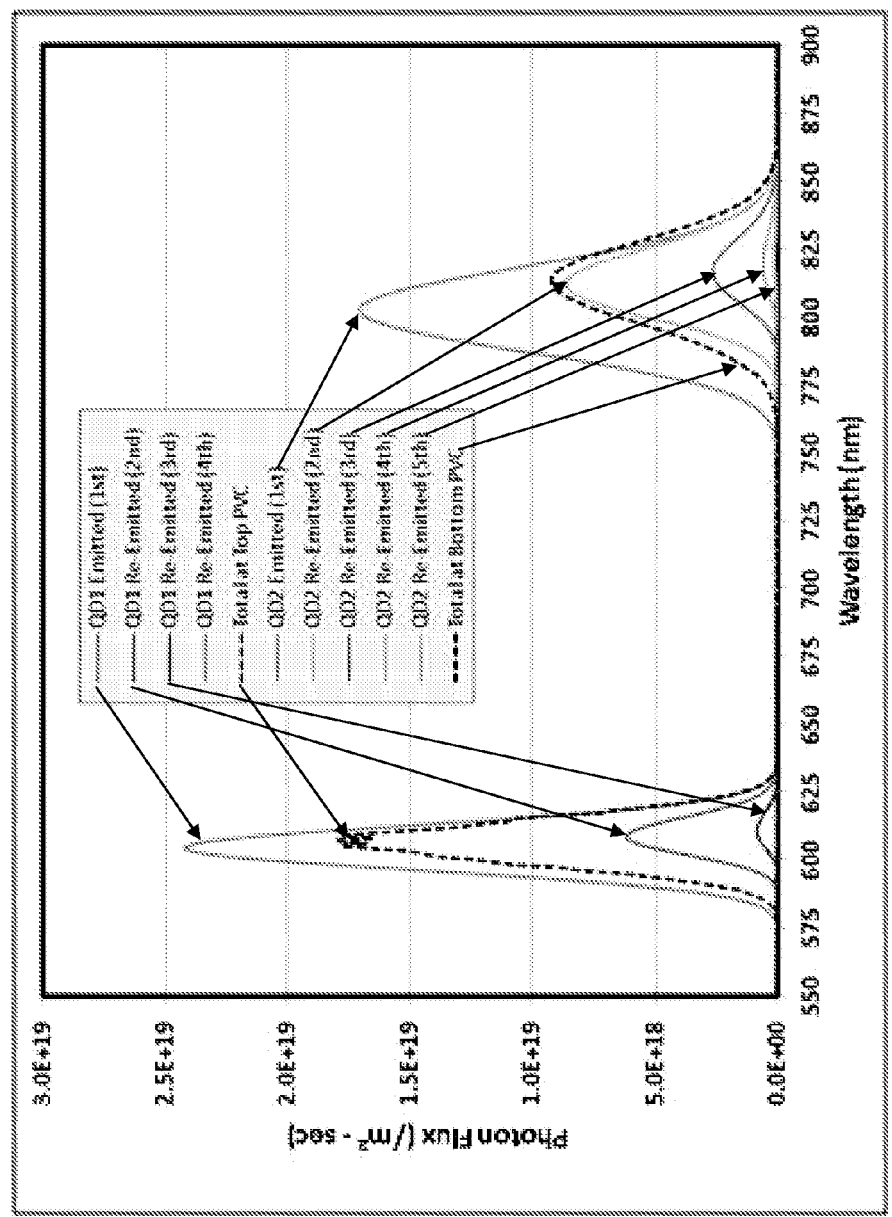
FIG. 6 shows predicted evolution of the luminescence wavelength distribution for a particular set of upper and lower LSC QDs.

By way of example, FIG. 6 shows the predicted evolution of the luminescence wavelength distribution for a particular set of upper and lower LSC QDs. As mentioned, the peak continually shifts toward longer wavelengths; this is advantageous to system efficiency because it represents a move away from further re-absorption. However, the shift itself only occurs because of a number of re-absorption/re-emission cycles taking place. To maintain good energy efficiency, the QDs in this case must have a high Quantum Yield (QY). Because the model tracks the wavelength of each population of luminescent photons, it can present the modeled spectrum that arrives at the PVCs. This can be coupled with the wavelength dependence of the PVC efficiency to compute an accurate value of the expected PVC output for the collected luminescence spectrum.

As discussed above, collection efficiency increases with increasing RI of the polymer component of the LSC layers. Other important qualities for the polymer are the transmissivity, lack of scattering, flexibility, solubilization of the luminophore, chemical stability and photostability. High Refractive Index (HRI) polymers can be classified as intrinsic, where the index is determined by the qualities of the polymer backbone itself, or extrinsic, where additives such as HRI nanoparticles are incorporated into the polymer. Intrinsic HRI polymers include aromatic or heterocyclic ring structures, aromatic etherketones, sulphur containing groups, halogen or phosphorus derivatives and organometallics. Extrinsic HRI polymers include polymers with inorganic components such as PbS, ZnS, $TiO_2$, $ZrO_2$, $HfO_2$, and others.

Investigation of candidate base polymers determined that copolymers with lauryl methacrylate (LMA) solubilized the quantum dots without phase separation or hazing. In representative embodiments, copolymers of hafnium carboxyethyl acetate (HCA) and lauryl methacrylate (LMA) or methylmethacrylate (MMA) were made with incorporated quantum dots. A preferred base polymer configuration is lauric acid substituted Hafnium carboxyethylacrylate (HCA) and methyl methacrylate (1:1 by weight), resulting in a refractive index of 1.71 for the base polymer and increasing to 1.78 with incorporation of quantum dots at 1 mg $QD/cm^2$ polymer). HCA and lauryl methacrylate (LMA) were found to copolymerize well up to 30% LMA. More LMA lowers the refractive index, and less makes the film more brittle. Modifying the HCA to incorporate lauric acid increases the Hafnium content, which raises the RI of the final polymer. Heavier elements such as Zr, Hf and Br have highly polarizable electron densities and thus increase RI. The modified HCA is miscible with LMA and provides crosslinking An exemplary extrinsic base polymer host system was selected consisting of laurel methacrylate, ethylene glycol dimethacrylate and solubilized $HfO_2$ nanoparticles. A preferred embodiment consists of lauryl methacrylate (LMA), ethylene glycol dimethacrylate (EGDMA) (4:1 by weight) and hafnium oxide nanoparticles solubilized by trioctylphosphine oxide (TOPO) or other suitable ligand. The refractive index with a 12% by weight $HfO_2$ and 7.25 mg/ml quantum dot was approximately 1.7.

Additional base polymers that may be used include Laurel Acrylate, BPA Acrylate, Thiolane Acrylate, Pentabromophenylmethacrylate, Ethylcarbazole acrylate and LA+$TiO_2$.

Plasticizers may be used to enhance film flexibility and counteract tendency to become brittle. Plasticizers are low volatility compounds soluble in the polymer that lower glass transition temperature. Given that some plasticizers are photosensitive and cause yellowing of the polymer, UV stable plasticizers are preferred.

Polymerization may be initiated optically or thermally. LSCs are typically cured between glass plates separated by flexible gaskets. For low QD concentrations UV curing is the method of choice. The photoinitiator used is 2,2 dimethoxyphenylacetophenone (DMPA) at 0.35% by weight. UV cure times typically vary from 2-12 hours, sometimes followed by an oven cure step at 60° C.

In some cases, photopolymerization using initiators such as DMPA is not ideal as the absorption of the QDs increases in the blue end of the spectrum. QDs optimized for increased solar absorption may cause interference with the performance of the photoinitiator. Accordingly, for higher QD concentration LSCs thermal initiators are used for polymerization. In order to ensure optimal surface texture of the resulting polymer film, specialized process development techniques are employed which include a slow ramp up of 1 degree per minute from room temperature up to the cure temperature typically between 60-70° C. in a water bath and a slow ramp down to room temperature of 1 degree per minute after polymerization. Cure times range from 4 to 18 hours.

Exemplary 600 nm and 800 nm QD materials for use in the embodiments described herein are available from QD Vision, Inc. and may include II-VI semiconductor materials such as CdS, CdSe, CdTe, ZnS, ZnSe, and others. Representative QD materials are also described in one or more of the following documents which are incorporated herein by reference in their entirety: Kim, S.; Fisher, B.; Eisler, H. J.; Bawendi, M., Type-II Quantum Dots: CdTe/CdSe(Core/Shell) and CdSe/ZnTe(Core/Shell) Heterostructures, *J Am. Chem. Soc.* 2003, 125, 11466; Ivanov, S. A.; Piryatinski, A.; Nanda, J.; Tretiak, S.; Zavadil, K. R.; Wallace, O.; Werder, D.; Klimov, V. I., Type-II Core/Shell CdS/ZnSe Nanocrystals: Synthesis, Electronic Structures, and Spectroscopic Properties, *J. Am. Chem. Soc.* 2007, 129, 11708; C. B. Murray, D. J. Norris, M. G. Bawendi, J. Am. Chern. Soc. 1993, 115, 8706; M. G. Bawendi, A. R. Kortan, M. L. Steigerwald, L. E. Brus, J. Chem. Phys. 1989, 91, 7282; C. B. Murray, C. R. Kagan, M. G. Bawendi, Annu Rev. Mater. Sci. 2000, 30, 545; B. P. Dabbousi, J. Rodriguez-Viejo, F. V. Mikulec, J. R. Heine, H. Mattoussi, R. Ober, K. F; Jensen, M. G. Bawendi, J. Phys. Chem. B 1997, 101, 9463; B. O. Dabbousi, O. Onitsuka, M. G. Bawendi, M. F. Rubner, Appl. Phys. Lett. 1995, 66, 1316; M. A. Hines, P. Guyot-Sionnest, J. Phys. Chem. 1996, 100, 468; S. Coe-Sullivan, W. K. Woo, J. S. Steckel, M. G. Bawendi, V. Bulovic, Org. Electron. 2003, 4, 123; R. Xie, U. Kolb, J. Li, T. Basche, A. Mews, J. Am. Chem. Soc. 2005, 127, 7480; Peng, X. G.; Manna, L.; Yang, W. D.; Wickham, J.; Scher, E.; Kadavanich, A.; Alivisatos, A. P., Shape control of CdSe nanocrystals, Nature 2000, 404, (6773), 59-61; Pradhan, N.; Goorskey, D.; Thessing, J.; Peng X., An Alternative of CdSe Nanocrystal Emitters: Pure and Tunable Impurity Emissions in ZnSe Nanocrystals, J. Am. Chem. Soc. 2005, 127, 17586; Dabbousi, B. O.; Rodriguez-Viejo, J.; Mikulec, F. V.; Heine, J. R.; Mattoussi, H.; Ober, R.; Jensen, K. F.; Bawendi, M. G., (CdSe)ZnS Core-Shell Quantum Dots: Synthesis and Characterization of a Size Series of Highly Luminescent Nanocrystallites., J. Phys. Chem. B 1997, 101, 9463; and Peng, X.; Schlamp, M. C.; Kadavanich, A. V.; Alivisatos, A. P., Epitaxial Growth of Highly Luminescent CdSe/CdS Core/Shell Nanocrystals with Photostability and Electronic Accessibility, J. Am. Chem. Soc. 1997, 119, 7019.

In a preferred embodiment, at least one of the LSC layers is formed of a combination of polymer, QD and an additional luminophore, e.g., dye, in order to fill absorption gaps in the polymer/QD layer. In a particular example, lumogen red dye was added to the nominally 600 nm QD emitter system (available from, e.g., QD Vision, Inc.). Table 1 below highlights the improved unit cell power with the added lumogen over that measured with the QD alone. One skilled in the art recognizes that the various combinations of polymer/QD/luminophore fillers may be determined to optimize absorption and that such experimentation and optimization is within the skill of one skilled in the art.

TABLE 1

| QD conc | Lumogen conc (mg/ml) | Unit Cell Power (μW) |
|---|---|---|
| 2.90 | N/A | 723 |
| 2.90 | 0.2 | 1147 |
| 2.90 | 0.5 | 1315 |
| 7.25 | N/A | 704 |
| 7.25 | 0.2 | 1082 |
| 7.25 | 0.5 | 1031 |

Accordingly, a preferred LSC collection system in accordance with FIGS. 1 and 3 includes a $QD_1$ LSC layer absorbing formed of the polymer/QD/lumogen red dye combination and a $QD_2$ LSC layer absorbing formed of polymer/800 nm emitting QD. In this configuration, connected to 1×5 array of GaAs PVCs, the $QD_1$ LSC in the stack was found to produce 215% of the bare PV power and the $QD_2$ LSC produced 102% of the bare PV power. Numerical optical modeling indicates that an optimized LSC system with emission at circa 600 and 800 nm with 95% QY for each emitter; 60% narrow band efficiency PVCs stamped directly on the LSC waveguide; geometric concentration ratio of 10; polymer refractive index of 1.8; a spectral mirror (SM) below the top LSC for 2 passes of solar photons below 510 nm; a band pass filter on the bottom LSC layer passing all radiation below 780 nm and reflecting 100% at 780 nm and longer; and a lower surface mirror reflecting 99% to plug loss the cone; can produce an overall system efficiency of 12%.

The following publications, incorporated herein by reference in their entirety, include descriptions of various exemplary QD configurations and compositions that may be used in one or more embodiments described herein: United States Patent Application No. 2011/0245533 to Breen, et al.; United States Patent Application No. 2010/0314646 to Breen, et al.; U.S. Pat. No. 6,476,312 to Barnham and Bomm, et al., "Fabrication and full characterization of state-of-the-art quantum dot luminescent solar concentrators," Solar Energy Materials & Solar Cells 95 (2011) 2087-2094.

Figure 7A:
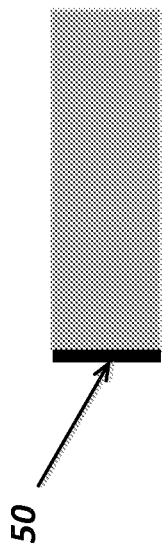
FIGS. 7a-7c show various cell geometries m accordance with multiple embodiments.
Figure 7B:
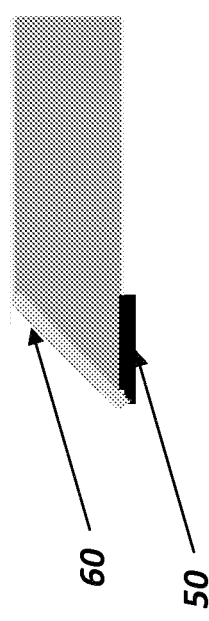
Figure 7C:
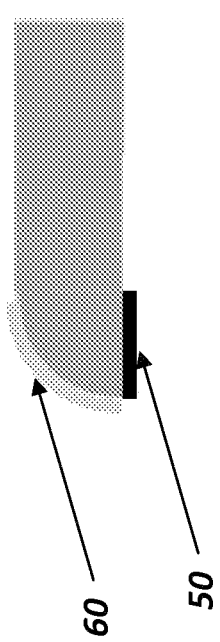
Figure 8A:
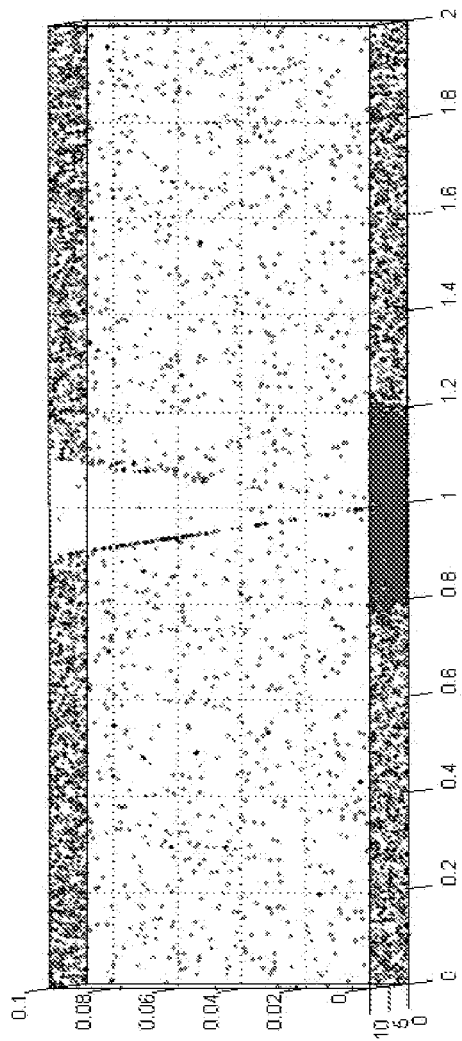
FIGS. 8a-8b show ray tracing for collection of radiation at a PVC for different exemplary geometries.
Figure 8B:
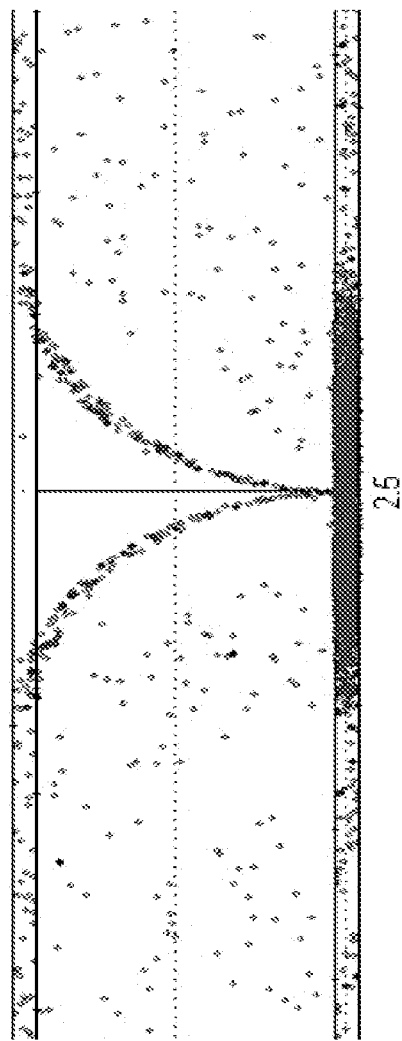

In addition to the various configuration specification and options described above, the placement of the PVCs and the use of mirrors to redirected light within the collection system to the PVCs is also a factor in maximizing system efficiency. FIGS. 7a-7c illustrate possible geometries for the individual unit cells. In FIG. 7a, the PVC 50 is edge mounted. In FIGS. 7b and 7c, the PVC 50 is bottom mounted. FIGS. 7b and 7c include reflective surfaces 60. In accordance with the ray tracing models shown in FIGS. 8a and 8b, the cylindrical mirror with bottom mounted PVC shown in FIG. 7c optimizes radiation concentration on the PVC (FIG. 8b) as compared to the 45 degree mirror with bottom mounted PVC shown in FIG. 7b (FIG. 8a). In addition to the configurations described and depicted herein, an additional configuration might include PVCs located on opposing faces of an individual cell, all faces of a cell, on top of the cell using a 2 side collecting PVC, or other combinations.

Figure 9:
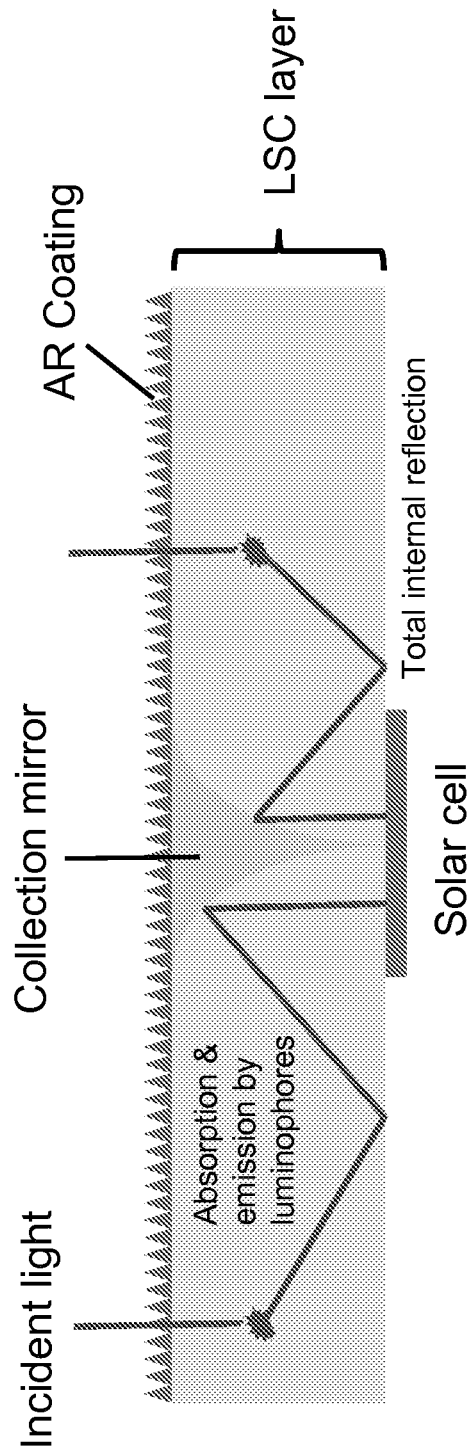
FIG. 9 is a schematic showing ray tracing for a cell in accordance with the geometry of FIG. 7c.

Referring to FIG. 9, a more detailed schematic of FIG. 7c is shown. A cylindrical mirror was fabricated by a soft lithographic stamping technique, and demonstrated the desired directional output from the mirror. The emission intensity from the mirror is comparable to that from an edge. Typically, PV cells are mounted on the edge of LSC sheet because the trapped light is guided to the edge. In the present embodiment, the PVCs are mounted at the bottom of LSC sheet. Such location is conducive to efficient mounting of cells in accordance with printing processes. The stamped cylindrical mirrors act as directional output couplers. Incident light is absorbed and emitted in LSC layer and travels to the cylindrical mirror, and then the light is directed onto the PV cells.

The cylindrical mirror master may be fabricated by micromachining and the polydimethylsiloxane (PDMS) stamp may be made from the master. A smooth surface master may be made by polymethylmethacrylate (PMMA) spin coating and PDMS stamping from the master. The cylindrical LSC part may be stamped by the PDMS stamp followed by a UV cure. A 200 nm silver mirror layer may then be deposited using electron beam evaporation. The mirror part is placed on the substrate and LSC solution is cast and cured under a UV lamp forming the LSC layer. Other metals and dielectric films may be used alternatively for the cylindrical mirror coating.

One skilled in the art recognizes and it is intended to be within the scope of the disclosure that the exemplary embodiments described above may be expanded to include one or more additional cells in the stack for coverage of additional portions of the solar spectrum, e.g., 1100 nm.

The embodiments set forth herein are intended to be exemplary of the concepts described and are not exhaustive. One skilled in the art recognizes variations to the embodiments that are well within the scope of the invention though not explicitly described.

We claim:

1. A luminescent solar collector system comprising:
   a first surface for receiving solar radiation;
   a first film layer for absorbing a first wavelength range of the received solar radiation and emitting a first amount of luminescent photons in proportion thereto, the first film layer including:
   (a) a first polymer base including a copolymer of hafnium carboxyethyl acrylate (HCA) and at least a second compound; and
   (b) first quantum dots;
   a second surface located opposite the first surface, wherein a top face of the second surface faces the first film layer and a bottom face of the second surface includes at least one first photovoltaic cell included thereon; and
   a first reflective surface located between the first and second surfaces for directing at least a portion of the first amount of luminescent photons to the at least one first photovoltaic cell.

2. The luminescent solar collector system of claim 1, wherein the first polymer base has a refractive index of at least 1.7.

3. The luminescent solar collector system of claim 1, wherein the at least a second compound is selected from the group consisting of lauryl methacrylate (LMA) and methylmethacrylate (MMA).

4. The luminescent solar collector system of claim 1, wherein the first quantum dots have a center line emission wavelength of approximately 600 nm.

5. The luminescent solar collector system of claim 1, wherein the first reflective surface is curved.

6. The luminescent solar collector system of claim 1, wherein the first reflective surface is located at a 45 degree angle to the second surface.

7. The luminescent solar collector system of claim 1, wherein a top surface of the first surface includes an anti-reflective coating thereon.

8. The luminescent solar collector system of claim 1, wherein the hafnium carboxyethyl acrylate (HCA) is lauric acid substituted hafnium carboxyethylacrylate (HCA).

9. The luminescent solar collector system of claim 1, wherein a weight ratio of hafnium carboxyethyl acrylate (HCA) to the at least a second compound is 1:1.

10. The luminescent solar collector system of claim 1, further comprising:
   a third surface facing the bottom face of the second surface;
   a second film layer for absorbing a second wavelength range of the received solar radiation and emitting a second amount of luminescent photons in proportion thereto, the second film layer including:
   (d) a second polymer base; and
   (e) second quantum dots;
   a fourth surface located opposite the third surface, wherein a top face of the fourth surface faces the second film layer and a bottom face of the fourth surface includes at least one second photovoltaic cell included thereon; and a second reflective surface located between the third and fourth surfaces for directing at least a portion of the second amount of luminescent photons to the at least one second photovoltaic cell.

11. The luminescent solar collector system of claim 10, wherein the second polymer base is a copolymer of hafnium carboxyethyl acrylate and at least a third compound.

12. The luminescent solar collector system of claim 11, wherein the at least a third compound is selected from the group consisting of lauryl methacrylate (LMA) and methylmethacrylate (MMA).

13. The luminescent solar collector system of claim 10, wherein the second quantum dots have a center line emission wavelength of approximately 800 nm.

14. A luminescent solar collector system comprising:
a first surface for receiving solar radiation;
a first film layer for absorbing a first wavelength range of the received solar radiation and emitting a first amount of luminescent photons in proportion thereto, the first film layer including at least first quantum dots and a base polymer including a copolymer of hafnium carboxyethyl acrylate and at least a second compound;
a second surface located opposite the first surface, wherein a top face of the second surface faces the first film layer and a bottom face of the second surface includes at least one first photovoltaic cell included thereon; and
a first reflective surface located between the first and second surfaces for directing at least a portion of the first amount of luminescent photons to the at least one first photovoltaic cell;
a third surface facing the bottom face of the second surface;
a second film layer for absorbing a second wavelength range of the received solar radiation and emitting a second amount of luminescent photons in proportion thereto, the second film layer including at least second quantum dots;
a fourth surface located opposite the third surface, wherein a top face of the fourth surface faces the second film layer and a bottom face of the fourth surface includes at least one second photovoltaic cell included thereon; and
a second reflective surface located between the third and fourth surfaces for directing at least a portion of the second amount of luminescent photons to the at least one second photovoltaic cell.

15. The luminescent solar collector system of claim 14, wherein the at least a second compound is selected from the group consisting of lauryl methacrylate (LMA) and methylmethacrylate (MMA).

16. The luminescent solar collector system of claim 14, wherein the hafnium carboxyethyl acrylate (HCA) is lauric acid substituted hafnium carboxyethylacrylate (HCA).

17. The luminescent solar collector system of claim 14, wherein a weight ratio of hafnium carboxyethyl acrylate (HCA) to the at least a second compound is 1:1.

18. A luminescent solar collector system comprising:
first and second opposing surfaces having a first film layer therebetween for absorbing a first wavelength range of a received solar radiation and emitting a first amount of luminescent photons in proportion thereto, the first film layer including at least first quantum dots and a base polymer including a copolymer of hafnium carboxyethyl acrylate and one of lauryl methacrylate and methylmethacrylate;
a third surface perpendicular to the first and second surfaces, contacting first ends thereof;
a fourth surface perpendicular to the first and second surfaces, contacting second ends thereof, wherein at least one of the third and fourth surfaces includes at least one first photovoltaic cell thereon; and
a first reflective surface located on at least one of the first and second surfaces for directing at least a portion of the first amount of luminescent photons to the at least one first photovoltaic cell;
a fifth surface opposite the second surface and separated therefrom by one of an air gap or a low index material, wherein the fifth surface and an opposing sixth surface have a second film layer therebetween for absorbing a second wavelength range of the received solar radiation and emitting a second amount of luminescent photons in proportion thereto, the second film layer including at least second quantum dots and a base polymer including a copolymer of hafnium carboxyethyl acrylate and one of lauryl methacrylate and methylmethacrylate;
a seventh surface perpendicular to the fifth and sixth surfaces, contacting first ends thereof;
an eighth surface perpendicular to the fifth and sixth surfaces, contacting second ends thereof, wherein at least one of the seventh and eighth surfaces includes at least one second photovoltaic cell thereon; and
a second reflective surface located on at least one of the fifth and sixth surfaces for directing at least a portion of the second amount of luminescent photons to the at least one second photovoltaic cell.

19. The luminescent solar collector system of claim 18, further comprising: a first spectral reflective coating located on the second surface for reflecting received solar radiation having a wavelength shorter than a first predetermined cut-off value back into the first film layer and allowing to transmit therethrough to the second film layer received solar radiation having a wavelength longer than the first predetermined cut-off value.

20. The luminescent solar collector system of claim 19, further comprising: a second spectral reflective coating located on the fifth surface for reflecting a percentage of emitted luminescent radiation having a wavelength longer than a second predetermined cut-off value back into the second film layer and allowing to transmit therethrough both solar radiation and emitted luminescent radiation from the first film layer having a wavelength shorter than the second predetermined cut-off value.

* * * * *